United States Patent
Chen et al.

(10) Patent No.: US 7,875,873 B2
(45) Date of Patent: Jan. 25, 2011

(54) PHASE CHANGE MATERIALS AND ASSOCIATED MEMORY DEVICES

(75) Inventors: Yi-Chou Chen, San Jose, CA (US); Frances Anne Houle, Fremont, CA (US); Simone Raoux, Santa Clara, CA (US); Charles Rettner, San Jose, CA (US); Alejandro Gabriel Schrott, New York, NY (US)

(73) Assignees: International Business Machines Corporation, Armonk, NY (US); Macronix International Co., Ltd., Hsinchu (TW)

( * ) Notice: Subject to any disclaimer, the term of this patent is extended or adjusted under 35 U.S.C. 154(b) by 227 days.

(21) Appl. No.: 12/336,497

(22) Filed: Dec. 16, 2008

(65) Prior Publication Data

US 2009/0095953 A1 Apr. 16, 2009

Related U.S. Application Data

(63) Continuation of application No. 11/465,077, filed on Aug. 16, 2006, now Pat. No. 7,501,648.

(51) Int. Cl.
*H01L 45/00* (2006.01)
(52) U.S. Cl. .................................. 257/4; 257/E45.003
(58) Field of Classification Search .................... 257/2, 257/3, 4, E29.592
See application file for complete search history.

(56) References Cited

U.S. PATENT DOCUMENTS

| 5,596,522 A | * | 1/1997 | Ovshinsky et al. | .......... 365/113 |
| 5,825,046 A | * | 10/1998 | Czubatyj et al. | .............. 257/2 |
| 7,279,380 B2 | * | 10/2007 | Lung | .......................... 438/244 |
| 7,491,573 B1 | * | 2/2009 | Schrott et al. | ................. 438/95 |

* cited by examiner

*Primary Examiner*—Roy K Potter
(74) *Attorney, Agent, or Firm*—Daniel E. Johnson

(57) ABSTRACT

A memory device utilizes a phase change material as the storage medium. The phase change material includes at least one of Ge, Sb, Te, Se, As, and S, as well as a nitride compound as a dopant. The memory device can be a solid-state memory cell with electrodes in electrical communication with the phase change medium, an optical phase change storage device in which data is read and written optically, or a storage device based on the principle of scanning probe microscopy.

20 Claims, 14 Drawing Sheets

PHASE CHANGE MATERIALS AND ASSOCIATED MEMORY DEVICES

This application is a continuation of Applicant's co-pending U.S. patent application Ser. No. 11/465,077 filed Aug. 16, 2006 and entitled "PHASE CHANGE MATERIALS AND ASSOCIATED MEMORY DEVICES", which is hereby incorporated by reference.

TECHNICAL FIELD

The present invention relates to phase change materials, and more particularly, to memory devices employing a phase change material as the storage medium.

BACKGROUND

A phase change material (PCM) undergoes a phase change in response to an external stimulus, such as heat. This phase change is associated with a change in a physical property, such as electrical resistance or optical reflectivity, which can be measured to determine the phase of the material. A PCM is typically switched between a largely amorphous (high resistance) state and a largely crystalline (low resistance) state. This switching may be induced through heating the PCM by passing relatively high current through it, whereas reading or sensing the state of the PCM may be accomplished by passing relatively low current through it. More specifically, heating the high resistance, amorphous PCM to its crystallization temperature $T_c$ for a long enough time changes the phase of the PCM to the low resistance, crystalline state (known as the SET process). Heating the PCM to an even higher temperature above the melting point $T_m$ followed by fast quenching changes the phase of the PCM back to its amorphous state (known as the RESET process). Unfortunately, switching the PCM may subject it to significant stress, which may limit the number of useful switching cycles. Typical materials suitable for electrically switchable phase change material memory elements include the chalcogenides, such as $Ge_2Sb_2Te_5$ (GST).

Memory devices incorporating a PCM are generally non-volatile and capable of high read and write speeds. Furthermore, phase change materials may be incorporated into a variety of devices and architectures, such as solid-state crosspoint arrays, in which the state of each cell is determined by measuring its resistance. In a crosspoint array, the cell size can approach approximately $4F^2$ (where "F" stands for "feature", e.g., the minimum resolvable lithographic feature), which is the minimum cell size that can be effectively addressed by electrical interconnects for a two interconnect level design. In view of their high-speed performance and non-volatile nature, PCM memory devices have the potential to compete with existing memory devices. For solid state memory devices, one desired parameter of the PCM is relatively high resistivity in both the amorphous and crystalline states. High resistivities lead to a high voltage drop and higher power deposition for a given current pulse, which in turn means less current is required to switch the cell from the crystalline state to the amorphous state (and vice versa).

In addition to being suitable for use as the storage medium in solid-state memory devices, phase change materials may also serve as the storage medium in optical storage disks and scanning probe microscopy-based devices. For optical storage devices, a large change in reflectivity between the amorphous and crystalline phases is needed for optimum disk performance. Every kind of PCM-based memory device preferably includes a PCM having an amorphous phase that is highly stable against crystallization at elevated temperatures, since memory devices may need to operate at temperatures of 90-100° C. for long periods of time.

In general, the desirable properties of a PCM include high resistivity (especially in the crystalline phase to reduce the RESET current, if a solid state device is being used) and a high transition temperature to enhance thermal stability. What would be particularly advantageous for good solid-state PCM cell performance is a resistivity in the crystalline state of around 0.1 Ohm-cm, an on/off ratio larger than 100 (with this ratio being defined as the resistivity in the amorphous state to that in the crystalline state), a transition temperature above 150° C. (preferably in the 250-300° C. range for good thermal stability), and a crystallization time less than 100 ns. The present invention satisfies these requirements.

SUMMARY OF THE INVENTION

Preferred embodiments of the invention include a memory device that has a phase change storage medium fabricated by doping a phase change material (which includes at least one, and preferably two or more, of the elements Ge, Sb, Te, Se, As, and S) with one or more nitride compounds. Doping a phase change material (PCM) with a nitride compound $A_xN_y$ (where A is a nitride-forming element such as Si or Ti) is found to have a much stronger effect on the resistivities (in both the amorphous and crystalline states) and on the transition temperature than doping with either the element A or nitrogen alone. It has been demonstrated experimentally that this is due to the formation of nitride compounds in the phase change material. One preferred phase change material is Ge—Sb, in which the symbol "—" indicates that the phase change material is not necessarily of a eutectic composition but nevertheless consists substantially of Ge and Sb.

One preferred embodiment of the invention is a device that includes a PCM that includes at least one of the elements Ge, Sb, Te, Se, As, and S, as well as at least one nitride compound as a dopant. The nitride compound constitutes at least 1 atomic percent of the phase change material. The dopant, said at least one element, and concentrations of the dopant and said at least one element are selected so that the phase change material has a crystallization temperature of at least 250° C., a resistivity of at least 0.001 Ohm-cm, and a crystallization time of less than 20 nanoseconds. (The dopant, said at least one element, and concentrations of the dopant and said at least one element may also be selected so that the phase change material has a crystallization temperature of at least 270° C., a resistivity of at least 0.01 Ohm-cm, and a crystallization time of less than 10 nanoseconds.) The device further includes a component that includes at least one of the following: a) electrodes for passing current through the phase change material, thereby heating the phase change material, b) a scanning probe microscopy-based element for applying heat to the phase change material, and c) a laser having output used to heat the phase change material. This component enables the device to perform at least one of the following: reading data from the phase change material and writing data into the phase change material. In a preferred embodiment, the phase change material includes at least one of Ge and Sb, e.g., it may include at least one of Ge—Sb, Ge—Sb—Te, Sb—Te, and Ge—Te. The nitride compound may include at least one of the compounds $Al_xN_y$, $Al_xO_yN_z$, $Ti_xN_y$, $Ta_xN_y$, $Si_xN_y$ (e.g., $Si_3N_4$), and $Si_xO_yN_z$, in which each of x, y, and z is greater than 0 (i.e., each of the named elements is present in the nitride compound). The nitride compound preferably constitutes greater than 20 atomic percent of the phase change material, more preferably greater than 25 atomic percent, and still more preferably greater than 30 atomic percent.

Another preferred embodiment of the invention is a device that includes a phase change material that includes the elements Ge and Sb, as well as at least one nitride compound as a dopant. The nitride compound constitutes at least 1 atomic percent of the phase change material. The dopant and concentrations of the dopant and the elements are selected so that the phase change material has a crystallization temperature of at least 250° C. and a resistivity of at least 0.001 Ohm-cm. (More preferably, said at least one element, the dopant, and concentrations of the dopant and said at least one element are selected so that the phase change material has a crystallization temperature of at least 270° C. and a resistivity of at least 0.01 Ohm-cm.) The device further includes a component that includes at least one of the following: a) electrodes for passing current through the phase change material, thereby heating the phase change material, b) a scanning probe microscopy-based element for applying heat to the phase change material, and c) a laser having output used to heat the phase change material. This component enables at least one of the following: reading data from the phase change material and writing data into the phase change material. One preferred phase change material is doped Ge—Sb. The dopant may include N and Si, such as $Si_xN_y$ or $Si_xO_yN_z$, in which each of x, y, and z is greater than 0. The dopant may advantageously include greater than 20 atomic percent of the phase change material, but more preferably greater than 25 atomic percent, and still more preferably greater than 30 atomic percent. In one preferred embodiment, there are electrodes disposed on different sides of the phase change material for conducting electrical current through the phase change material; a substrate underlying the phase change material; and a capping layer overlying the phase change material.

Another embodiment of the invention is a phase change material that includes Ge and Sb, as well as a nitride compound as a dopant (e.g., nitride-doped Ge—Sb). The nitride compound constitutes at least 1 atomic percent of the phase change material (or preferably at least 5 atomic percent of the phase change material), and the phase change material has at least two phases having respective resistivities whose ratio is at least 100. The phase change material may further include Te. The dopant may include N and Si, e.g., $Si_xN_y$ or $Si_xO_yN_z$, wherein each of x, y, and z is greater than 0. Other suitable dopants include $Ti_xN_y$, $Al_xO_yN_z$, $Al_xN_y$, and $Ta_xN_y$, wherein each of x and y is greater than 0. The nitride compound preferably constitutes greater than 20 atomic percent of the phase change material, more preferably greater than 25 atomic percent, and still more preferably greater than 30 atomic percent. The dopant and concentrations of the dopant, Ge, and Sb may be advantageously selected so that the phase change material has a crystallization temperature of at least 250° C. and a resistivity of at least 0.001 Ohm-cm. Also, the dopant and concentrations of the dopant, Ge, and Sb may be advantageously selected so that the phase change material has a crystallization temperature that is at least 60° C. greater (or more preferably at least 100° C. greater) than it would be in the absence of any nitride dopant.

For the dopant compounds disclosed herein, each of the elements that make up that compound preferably constitute at least 1 atomic % of the phase change material.

BRIEF DESCRIPTION OF THE DRAWINGS

FIG. 1, which includes FIGS. 1A, 1B, 1C, 1D, and 1E, illustrates a first embodiment of the invention, in which:

FIG. 1A shows a solid state, crosspoint memory cell architecture that employs phase change material as the storage medium;

FIG. 1B is a schematic corresponding to the architecture of FIG. 1A;

FIG. 1C is a schematic corresponding to an architecture in which each memory cell includes a select element and a phase change storage element; and FIGS. 1D and 1E illustrate different phase change storage elements;

DETAILED DESCRIPTION OF THE INVENTION

Various phase change materials are disclosed herein that may be advantageously used as the recording medium in a device used for information storage and/or retrieval. In one embodiment, the device includes a solid state memory cell array, in which each cell has phase change material (PCM) situated between two electrodes through which current is passed. Electrical current is used to selectively change the phase of the PCM in the memory elements, thereby recording data in them; current is also used for determining the phase of the PCM, thereby allowing data to be read from the elements. In another embodiment, a laser is used to record data in (or read data from) a layer of phase change material. In yet another embodiment, a scanning probe microscopy-based element is used to write data into (and read data from) a layer of PCM. These embodiments are now discussed in turn with respect to various figures, followed by a detailed discussion of the preferred phase change materials of this invention.

Embodiments

Figure 1A:
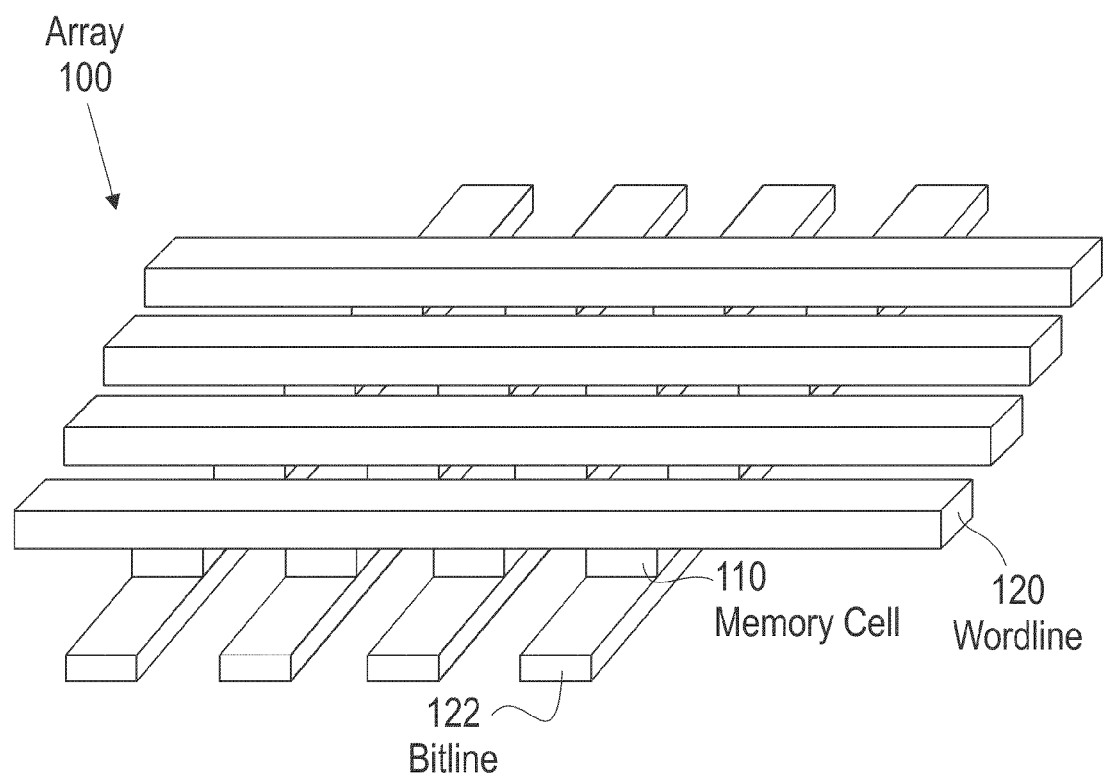
Figure 1B:
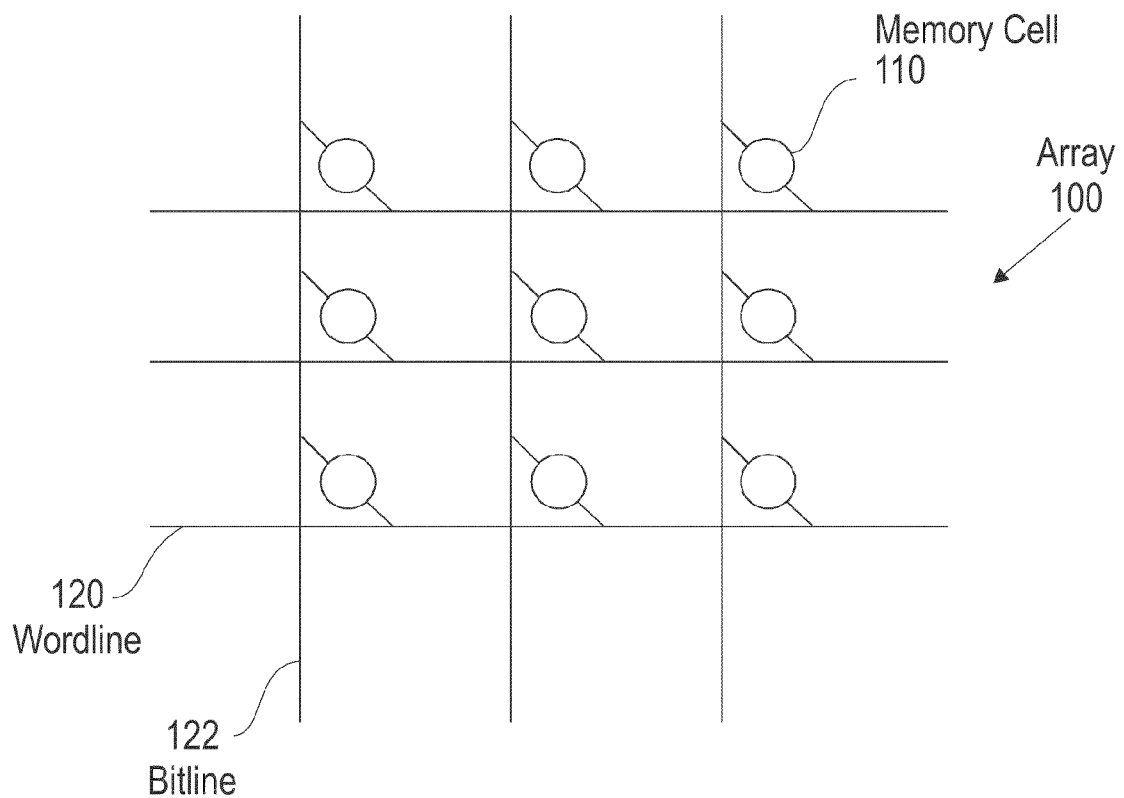

A solid state memory cell array 100 is shown in FIG. 1A, which illustrates a crosspoint memory cell architecture. An example of phase change memory compatible with crosspoint architecture is taught in U.S. Pat. No. 6,579,760 (issued Jun. 17, 2003 to Lung), which is hereby incorporated by reference. As shown in FIG. 1, memory cells 110 are situated at the respective "crosspoint" intersections of a conductive "word" line 120 and a conductive "bit" line 122. Each memory cell 110 includes PCM for storing at least one data bit, and current can be passed through the PCM of a particular memory cell by selectively applying voltage to the appropriate combination of word and bit lines. The crosspoint array of FIG. 1A may be represented by the schematic shown in FIG. 1B.

Figure 1C:
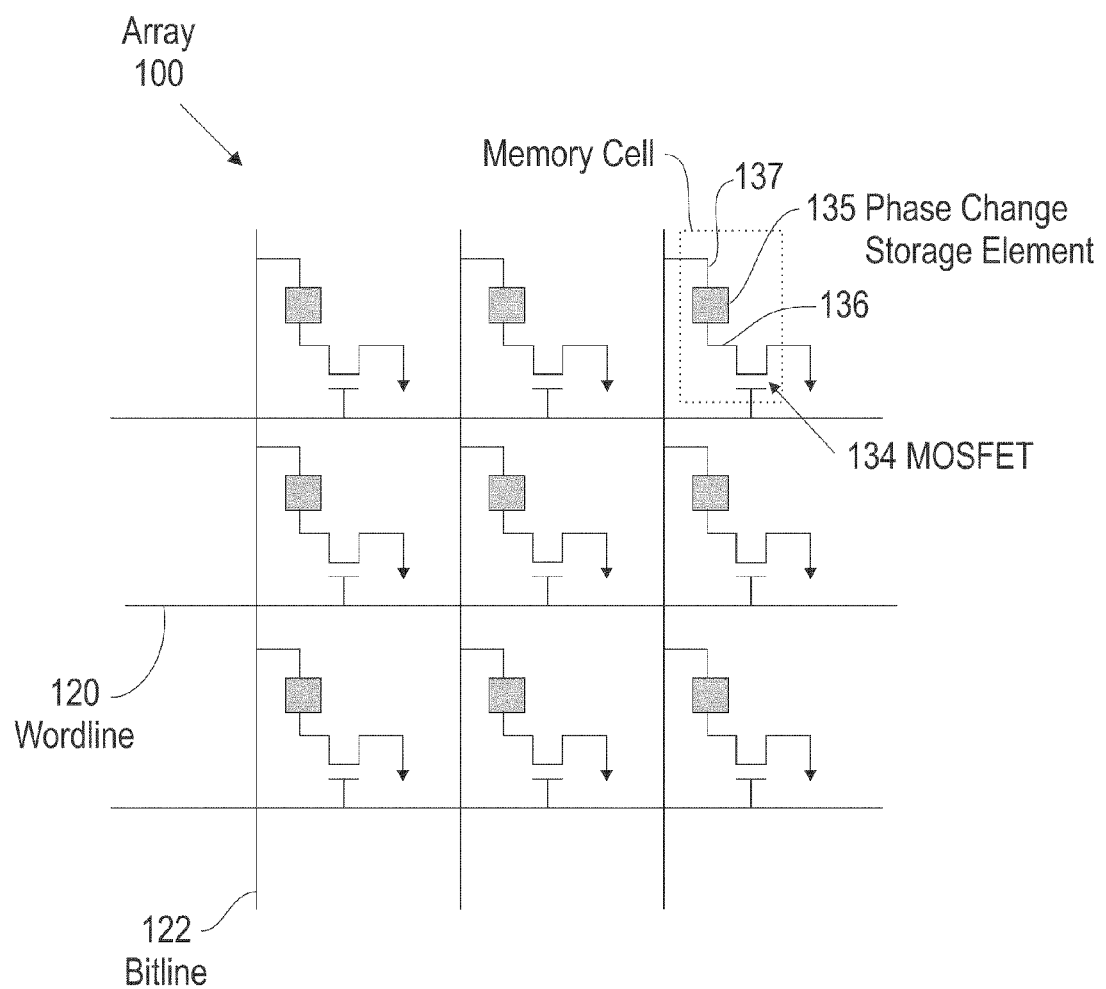

As suggested by the embodiment of FIG. 1C, the memory cells themselves can be rather complicated. In this embodiment, each cell includes a MOSFET (metal oxide semiconductor field effective transistor) 134 and a phase change storage element 135 that includes PCM. Each phase change storage element 135 is in electrical communication with a particular wordline 120 and a particular bitline 122. The MOSFET 134 is connected to the phase change storage element 135 via a conductive line 136, and the gate of the MOSFET is connected to a wordline 120. The phase change storage element 135 is also connected to a bitline 122 via another conductive line 137. As an alternative to the embodiment shown in FIG. 1C, a simplified memory cell can be employed in which the cell consists only of a phase change storage element 135 tied directly to a respective wordline 120 and a respective bitline 122. In still other embodiments, the memory cell may include a bipolar junction transistor (BJT) and a phase change storage element; a diode and a phase change storage element; or a tunneling diode and a phase change storage element.

Figure 1D:
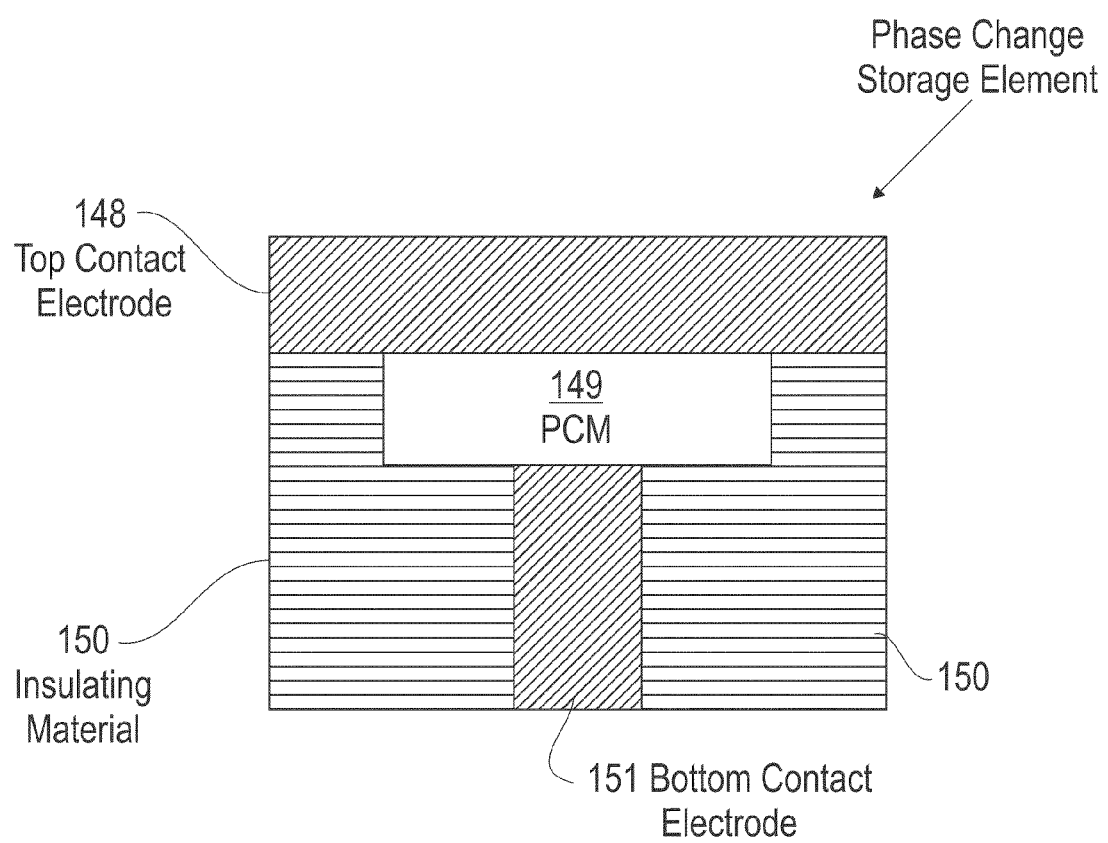
Figure 1E:
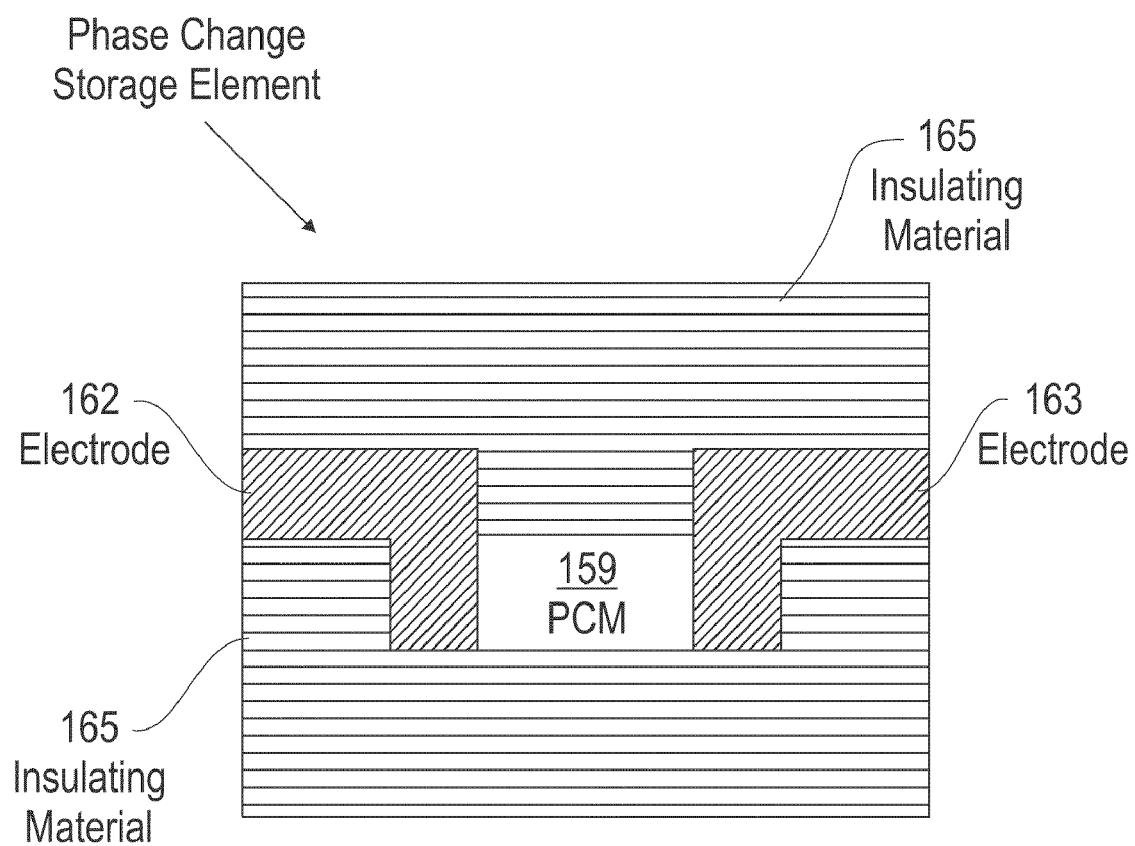

Possible configurations of the phase change storage element 135 are now described with respect to FIGS. 1D and 1E. In FIG. 1D, a top contact electrode 148 contacts one side of phase change material 149 that is embedded in insulating material 150 (e.g., $SiO_2$). A bottom contact electrode 151 contacts the other side of the phase change material 149. In FIG. 1E, phase change material 159 is positioned between two electrodes 162 and 163, which contact opposite sides of the phase change material. The phase change material 159 and the electrodes 162 and 163 are embedded in insulating material 165.

The electrodes of FIGS. 1D and 1E may be formed from TiN, TiW, W, or another electrically conducting material. The electrodes are in electrical communication with (e.g., in direct contact with) the wordlines 120 and the bitlines 122, so that by passing current through the phase change material, it can be programmed into a desired state (e.g., amorphous or crystalline) or have its state read out. In the configuration of FIG. 1D, current flows perpendicularly to the layer of phase change material 149, whereas in the configuration of FIG. 1E current flows within the plane of the phase change material 159. The phase change storage elements of FIGS. 1D and 1E may also include additional layers, such as heater layers or buffer layers. The phase change storage elements shown in FIGS. 1D and 1E are intended to be representative examples of such elements; preferred embodiments of the invention may include phase change storage elements of other designs known to those skilled in the art.

The phase change materials 149 and 159 of FIGS. 1D and 1E include at least one of the elements Ge, Sb, Te, Se, As, and S, in combination with a nitride compound as a dopant. As described in greater detail below, a nitride doped phase change material offers significant advantages over its undoped counterpart. Nitride-doped phase change materials along the pseudo-binary line of GeTe—$Sb_2Te_3$ (such as $Ge_2Sb_2Te_5$) are advantageous because of their very fast crystallization. In addition, the nitride-doped eutectic phase of GeSb (15 atomic % Ge, 85 atomic % Sb) is advantageous because of its relatively high crystallization temperature and excellent thermal stability. The dopant preferably comprises greater than 25 atomic % of the phase change material, and more preferably greater than 30 atomic %.

A recording layer of the phase change material can be formed by reactive sputtering of various elemental targets in a mixture of nitrogen and a noble gas such as argon. It can also be formed by using a compound phase change material target such as Ge(15%)Sb(85%) and co-sputtering the dopant from a nitride target (such as TiN or $Si_3N_4$) or from an elemental target (such as Si) in a gas mixture of nitrogen, a noble gas (such as argon), and possibly oxygen. Alternatively, it can be formed by sputtering from a compound target that contains all the required elements. The dopant concentration can be adjusted by varying the sputter conditions, such as the gas flow rate, the sputter power of the respective guns, and the compositions of the sputter targets themselves. Other deposition methods include, but are not limited to: thermal evaporation, laser ablation, chemical vapor deposition, and spin-coating deposition. The recording layer may advantageously have a dopant concentration that is not uniform throughout the phase change material (or the recording layer may include several different layers, each of which has a different dopant concentration or a different dopant), thereby creating a gradient in at least one of the phase change material's physical properties. The memory cell array 100, including the various layers in the phase change storage element, may be formed using techniques known to those skilled in the art.

Figure 2:
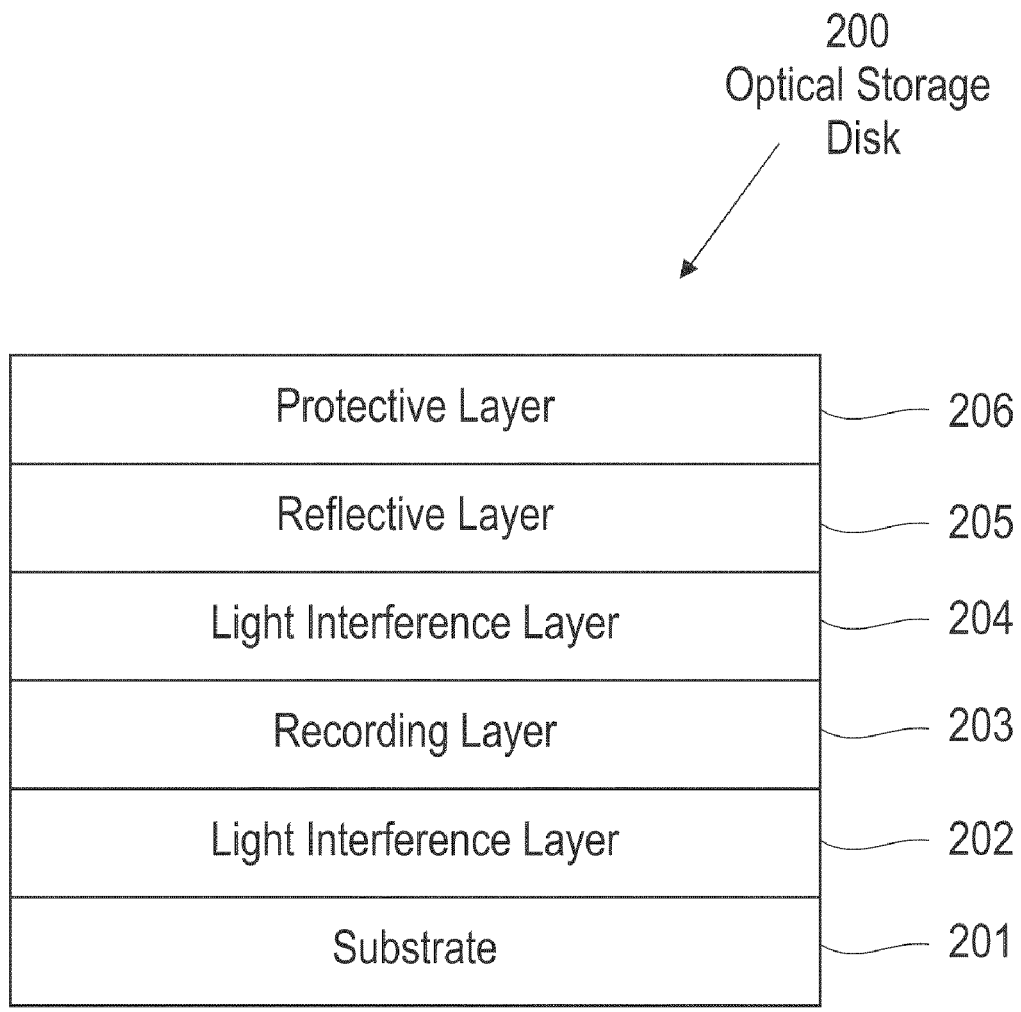
FIG. 2 illustrates a second embodiment of the invention, in which phase change material in an optical storage disk is used as the storage medium.

Another embodiment of the invention is now described with respect to FIG. 2, which shows an optical storage disk 200, in which information is stored as amorphous bits in a crystalline matrix or (less commonly) as crystalline bits in an amorphous matrix. (Optical storage disks are described in U.S. Pat. No. 6,607,869 to Kojima et al., which issued Aug. 19, 2003 and is hereby incorporated by reference.) Such an optical storage disk typically includes a substrate 201, a first light interference layer 202, a recording layer 203 of phase change material, a second light interference layer 204, a reflective layer 205, and a protective layer 206. The substrate 201 is typically synthetic resin such as polycarbonate, and it can have guiding tracks to improve disk performance. The light interference layers can include oxides, such as $SiO_2$, and nitrides, such as SiN, TiN, ZrN, GeN, or mixtures thereof such as ZnS—$SiO_2$. The recording layer 203 includes at least one of the elements Ge, Sb, Te, Se, As, and S, in combination with a nitride compound as a dopant. The recording layer can be formed by reactive sputtering, as described above with respect to the first embodiment of the invention. The reflective layer 205 comprises a metal layer such as Al, Au, or a metal alloy. The protective layer 206 may include a synthetic resin, e.g., an epoxy resin or an acrylic resin. The optical storage disk 200 may also include additional layers such as interface layers.

In this embodiment, electromagnetic radiation 208 from a laser 210 is directed onto the recording layer 203 to switch the state of the phase change material between the crystalline phase and the amorphous phase or vice versa. This can be done by heating amorphous material above the crystallization temperature for a sufficiently long time to crystallize the material, or by melting crystalline material that is then subsequently quenched in the amorphous state. A laser is also used to detect the state of the phase change material, since the amorphous and crystalline phases of a good optical phase change material have distinguishable reflectivities. Large amounts of data may be stored in, and retrieved from, the recording layer 203 by directing a laser onto different regions of the recording layer corresponding to different bits.

Figure 3:
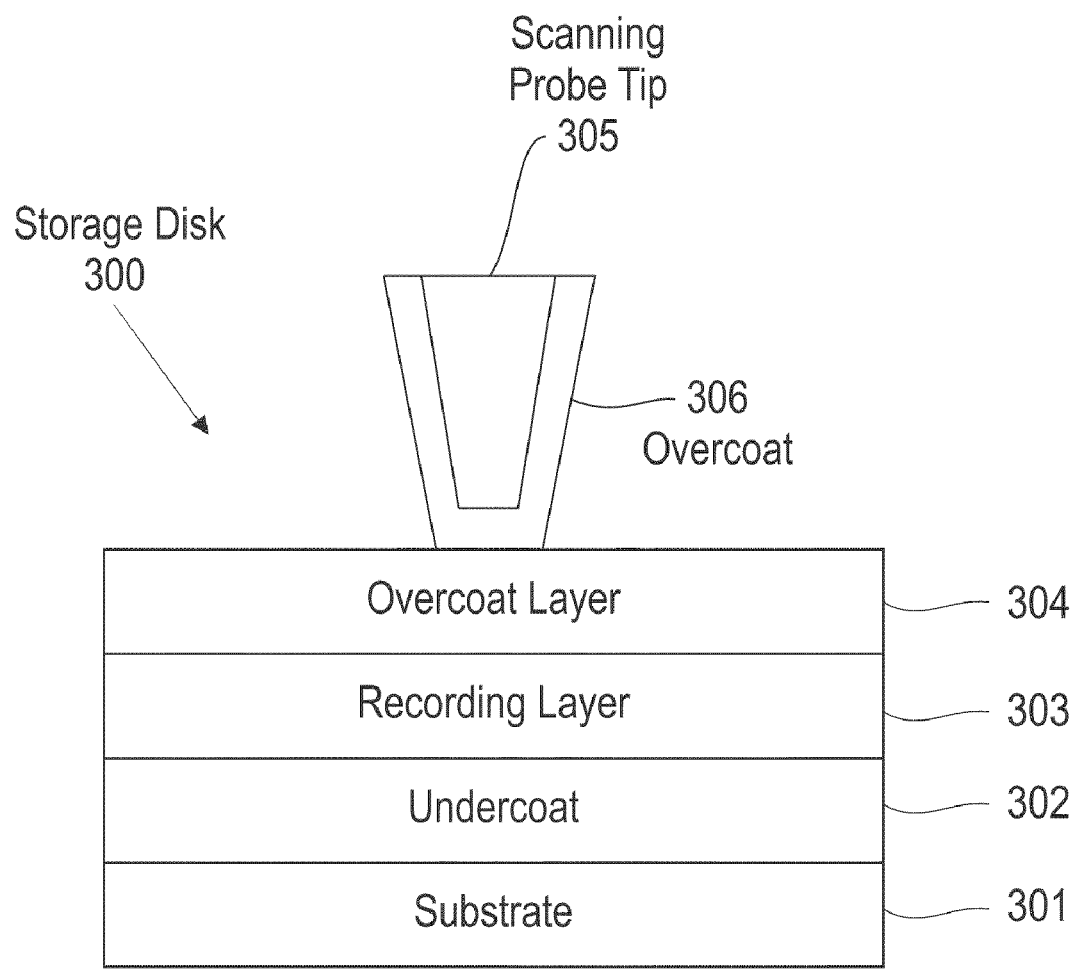
FIG. 3 illustrates a third embodiment of the invention, in which phase change material heated by a scanning probe tip is used as the storage medium.

A third embodiment of this invention is a phase change material storage device that is based on the principles of scanning probe microscopy. (Such devices are described in U.S. Pat. No. 6,985,377 to Rust, which issued Jan. 10, 2006 and is hereby incorporated by reference.) FIG. 3 shows a storage disk 300 that includes a substrate 301, an undercoat 302, a phase change material storage medium or recording layer 303, and a protective overcoat 304. The substrate 301 is preferably made from a material of low electrical conductivity. The storage disk may or may not contain an undercoat 302, which if used may be an insulator, such as an oxide or nitride, or a conductor such as W, Al, Au, Ag, or Cu, as discussed in U.S. Pat. No. 6,985,377. The phase change material storage medium 303 includes at least one of the elements Ge, Sb, Te, Se, As, and S, in combination with a nitride as a dopant. The recording layer 303 can be formed by reactive sputtering as described above in connection with the first embodiment of this invention. The protective overcoat 304 is a material that is harder than the phase change material of the recording layer 303; the overcoat can consist of a nitride, such as TiN or diamond-like carbon, which can be doped with other materials such as hydrogen or nitrogen.

In this embodiment, information is written and read by a scanning probe tip 305. This tip 305 can consist of highly doped Si or W, and it may be optionally covered by an overcoat 306 made from diamond or diamond-like carbon, or a metallic conducting layer such as Pt. Information is written into the phase change material of the recording layer 303 by passing an electric current through the scanning probe tip 305. If the phase change material of the recording layer 303 is initially amorphous and then heated to above the crystallization temperature for a long enough time, a phase transformation from the amorphous state to the crystalline state is induced. On the other hand, if crystalline phase change material is heated with an even higher current through the scanning probe tip 305 and then quickly cooled (melt-quenched), the phase change material is transformed back to the amorphous state.

Information is read by a small electrical current that passes through the scanning probe tip 305 and the phase change material. This current is too small to induce a phase transformation but still large enough to detect the resistivity of the phase change material, thereby determining whether the phase change material at the point of contact is in the amorphous or the crystalline state. Large amounts of data may be stored in, and retrieved from, the recording layer 303 by positioning the scanning probe tip 305 at different regions of the recording layer corresponding to different bits. Scanning probe based devices that contain an external heater (instead of passing current through the recording layer 303) to switch the phase change material are also contemplated.

Experimental Results and Reduction to Practice

To form the nitride-doped phase change materials disclosed herein, thin films were deposited on a substrate through the co-sputtering of at least one elemental target (e.g., Ge, Sb, Te, Si, Ta, and Ti) and/or at least one compound target (e.g., $Ge_2Sb_2Te_5$, GeSb, $Al_2O_3$, $SiO_2$, and TiN) in Ar, a mixture of Ar and $N_2$, or a mixture of Ar, $O_2$, and $N_2$. Films were deposited on Si wafers (for Auger electron spectroscopy, Secondary Ion Mass Spectrometry (SIMS), X-ray Photoelectron Spectroscopy (XPS), and Rutherford Back Scattering (RBS) analysis, which were used to determine the compositional content of the films), or on Si wafers coated with a 1 micron thick $SiO_2$ film (for measuring resistivity vs. temperature). Resistivity as a function of temperature was measured by forming, on each sample, two contacts having well-defined geometry, and then measuring the resistivity between these contacts while heating the sample in a nitrogen atmosphere to prevent oxidation.

The crystallization temperatures reported herein were determined from the peak of the derivative of the resistivity as a function of temperature. Other measurements of the crystallization temperature were undertaken by heating the samples in helium and measuring the intensity of the X-ray diffraction peaks as a function of temperature. This latter technique typically led to a deduced crystallization temperature that was slightly higher (about 10° C.) than that determined from the derivative of the resistivity, since the presence of even a small conducting current filament was enough to decrease the resistivity, but to find strong XRD peaks a large fraction of the films needed to be crystallized. The measurements of $T_c$ were precise to within 2° C.

Figure 4:
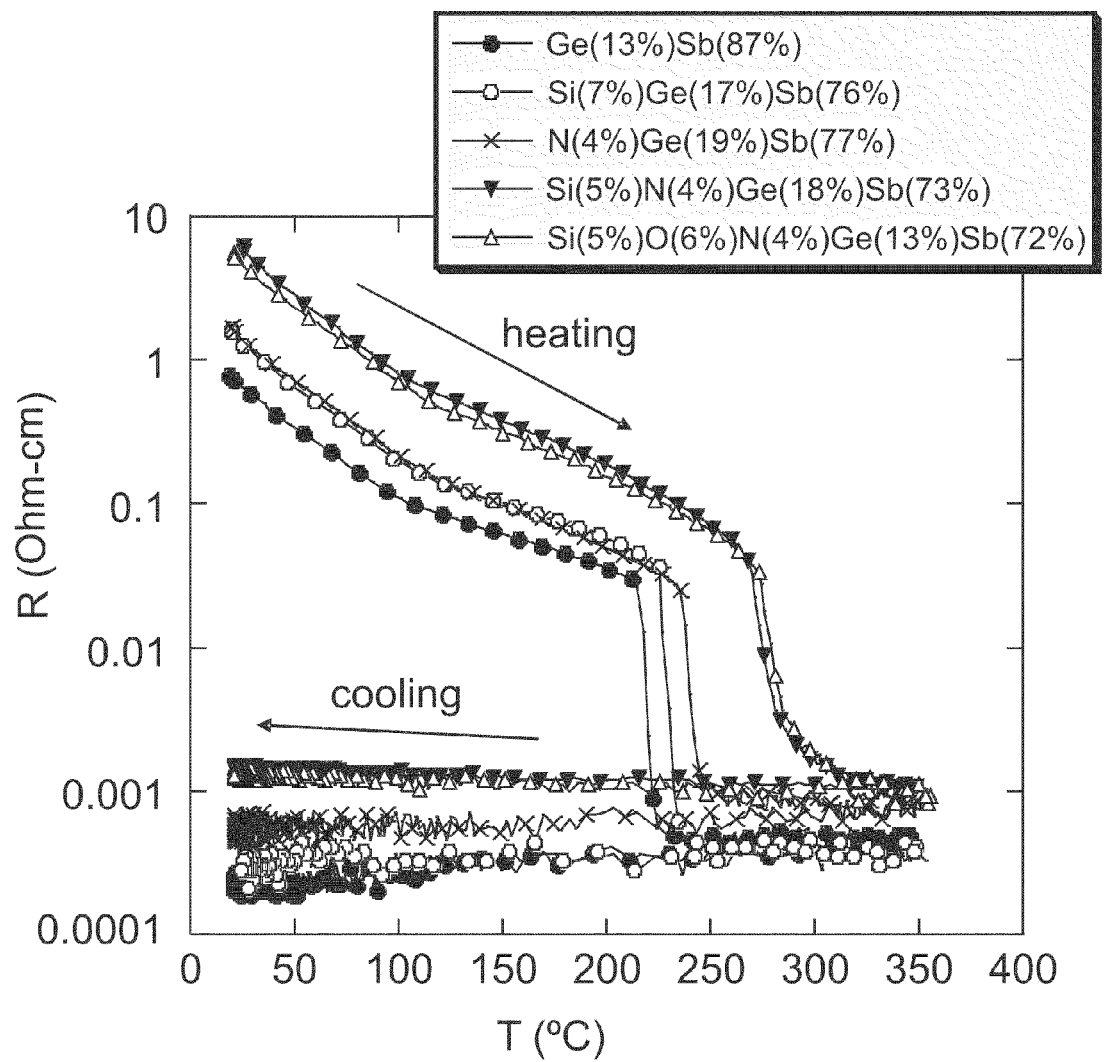
FIGS. 4 and 5 show resistivity data as a function of temperature for various doped and undoped Ge—Sb films.
Figure 5:
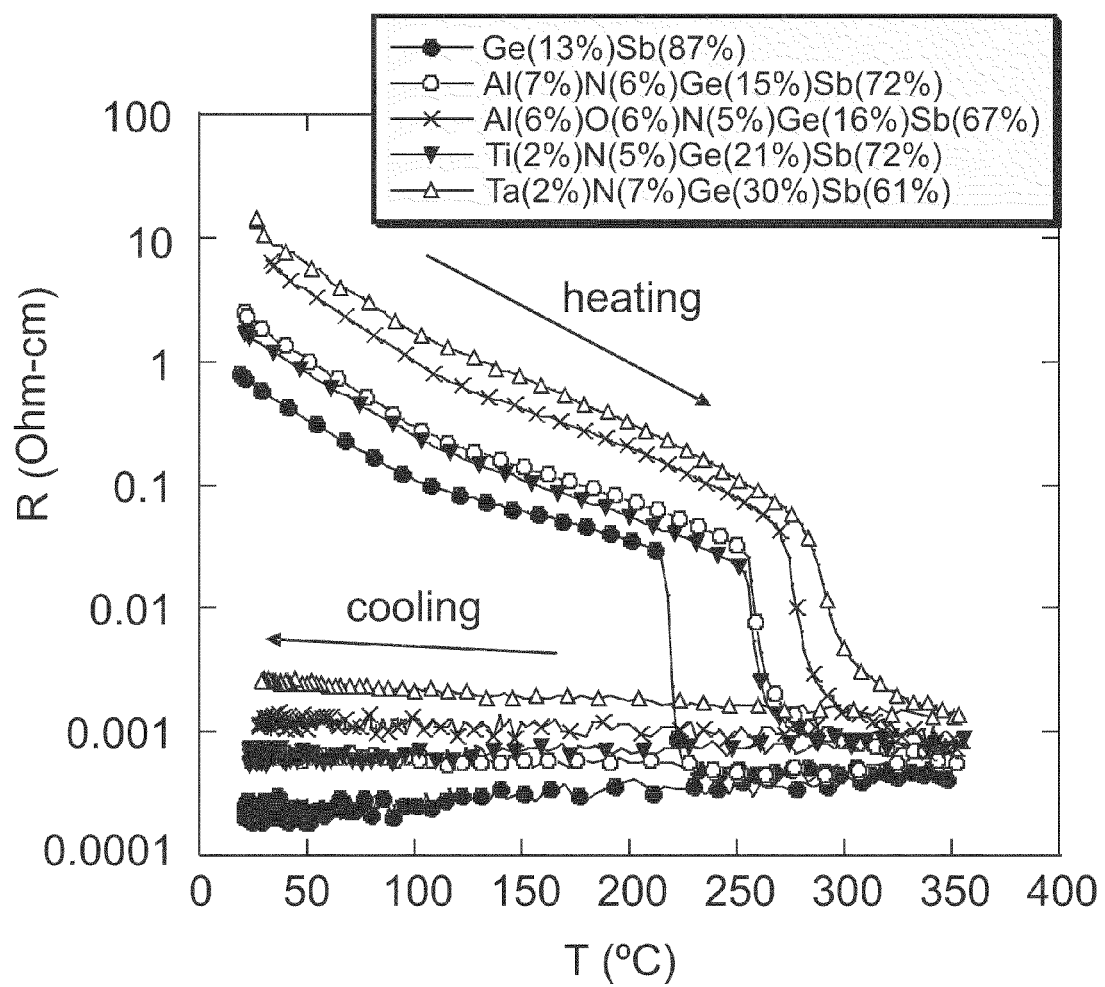
Figure 6:
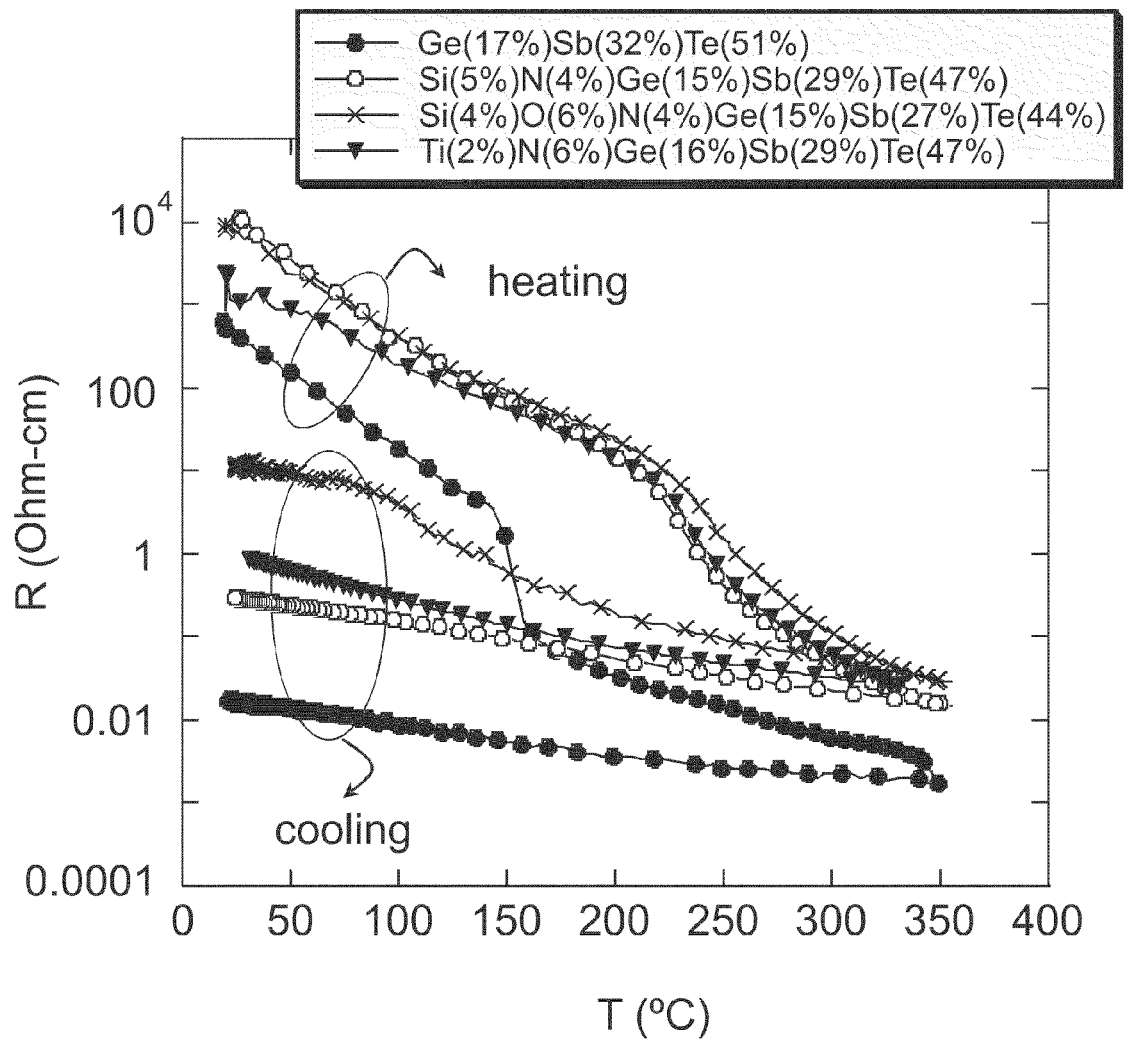
FIG. 6 shows resistivity data as a function of temperature for various undoped and nitride-doped Ge—Sb—Te films.

FIGS. 4 through 6 show data taken for various doped and undoped phase change materials as a function of temperature (both heating and cooling cycles are shown). As suggested by the arrows in these figures, an initially amorphous film was heated at the rate of 1 K/sec to above $T_c$ so that the film crystallized; the crystalline film was then allowed to cool to room temperature. The presence of the indicated nitride and oxide compounds in the phase change materials was confirmed by X-ray photoemission spectroscopy. When forming certain films, trace amounts of GeN (much less than 1 atomic percent) were also observed if excess nitrogen was used. Even when forming GST under extremely nitrogen-rich conditions (40 sccm nitrogen flow, compared with the more typical 5-10 sccm), the amount of GeN formed was determined to be less than 5 atomic %.

In FIG. 4, the resistivity of an undoped alloy of Ge—Sb (whose composition was close to the eutectic alloy of $Ge_{0.15}Sb_{0.85}$) is presented, along with data for Ge—Sb with various dopants (in which the Ge—Sb ratio was close to that of the eutectic alloy). Doping with only Si (7 atomic percent) or with only N (4 atomic percent) has a relatively small effect on the resistivity R and the crystallization temperature $T_c$ compared with doping with a nitride compound. Specifically, when a Ge—Sb alloy was doped with either $Si_xN_y$ (5 atomic % Si; 4atomic % N) or $Si_xO_yN_z$ (5 atomic % Si; 6 atomic % O; 4 atomic % N) a significant increase in both the resistivity (for both the amorphous and crystalline phases) and the crystallization temperature was found: The resistivity of these nitride-doped alloys in the amorphous phase was greater than 0.001 Ohm-cm, and $T_c$ was greater than 250° C. (about 270° C. or even higher). The highest R in the crystalline phase was obtained for a film of Si(15 atomic %)N(15 atomic %)—Ge (10.5 atomic %)Sb(59.5 atomic %); R for this sample was much greater than 0.1 ohm-cm and was measured to be about 1 ohm-cm. It should be noted that doping with $SiO_2$ alone was comparable in effect to doping with either Si or N.

FIG. 5 shows additional data for the eutectic alloy of Ge—Sb—both undoped as well as for the dopants $Al_xN_y$, $Al_xO_yN_z$, $Ti_xN_y$, and $Ta_xN_y$. The strongest effect is found for the dopants TiN and TaN, resulting in a comparatively large resistivity in the amorphous phase of greater than 0.001 Ohm-cm and a $T_c$ that was greater than 250° C. (and in the case of TaN about 275° C. or even higher). By contrast, doping the eutectic GeSb with only Ti led to a very strong reduction in the resistivity in the amorphous phase and the crystallization temperature, and when the eutectic GeSb was doped with only Ta, the doped material became conductive in the as-deposited state (comparable to crystalline, undoped Ge—Sb). Also, doping with either aluminum nitride or aluminum-oxinitride led to much more dramatic changes in R and $T_c$ than doping with Al, $Al_2O_3$, or N alone. Still other experiments demonstrated that nitride-doped Ge—Sb shows thermal stability that is superior to other phase change materials, such as Ge—Sb—Te. For example, heating of melt-quenched amorphous nitride-doped Ge—Sb to 220° C. for ten minutes did not lead to crystallization of this film.

FIG. 6 shows additional results for an alloy having a composition close to the stoichiometric $Ge_2Sb_2Te_5$ (GST), in which thin films of undoped GST and GST doped with $Ti_xN_y$, $Si_xN_y$, and $Si_xO_yN_z$ were investigated. Doping with either Si or N alone (results not shown in FIG. 6) led to relatively small changes in R and $T_c$ compared with doping with $Si_xN_y$ (see FIG. 6). Likewise, doping with either $SiO_2$ or N alone (results not shown in FIG. 6) led to relatively small changes in R and $T_c$ compared with doping with $Si_xO_yN_z$ (see FIG. 6).

Figure 7:
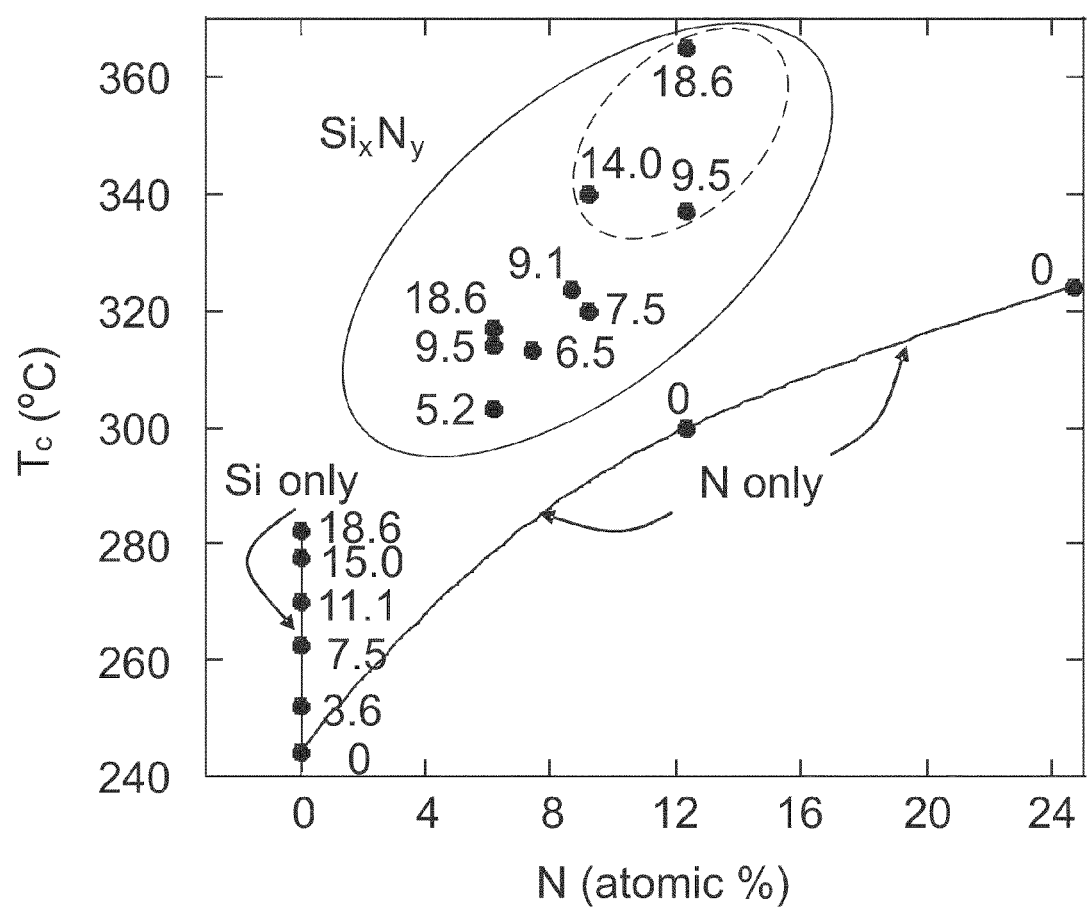
FIG. 7 shows how the crystallization temperature $T_c$ of a Ge—Sb alloy varies as a function of doping level for various nitrogen and silicon concentrations.

FIG. 7 shows the crystallization temperature $T_c$ as a function of doping levels for various nitrogen and silicon concentrations for an alloy that contains Ge:Sb in a ratio of 15:85 (i.e., 15 atomic % Ge for an undoped sample). The crystallization temperature was determined by the maximum of the derivative of the resistivity as a function of temperature. While it is clear from FIG. 7 that doping with only nitrogen or doping with only silicon does lead to an increase in $T_c$, doping with both nitrogen and silicon has a much stronger effect on $T_c$ than doping with just one element. Experimentally it was determined that this co-doping led to the formation of at least one nitride compound, which was responsible for the advantageous effects reported herein.

It is also evident from FIG. 7 that a given desired increase in $T_c$ can be achieved with different combinations of Si and N doping levels. In general, a significant enhancement in $T_c$ can be obtained when Si and N together constitute between 5 and 40 atomic % of the composition, but far better results are achieved when together they constitute greater than 20 atomic % of the composition (see the data points falling within the dashed line), or preferably even greater than 25, 30, or 35 atomic % of the composition. For example, a $T_c$ greater than 360° C. was observed in a film whose composition was given by Si(18.6 atomic %)N(12.3 atomic %)Ge(10.4 atomic %)Sb (58.7 atomic %)—for this film both dopants together constituted approximately 31 atomic % of the composition. This is a surprising and unexpected increase in $T_c$ of greater than 100° C. (an increase of approximately 120° C.) over the $T_c$ of the corresponding undoped Ge—Sb. As is evident from FIG. 7, doping with a nitride led to a relatively high $T_c$, for example, $T_c$s greater than 300° C., 340° C., and even 360° C. were realized.

Figure 8:
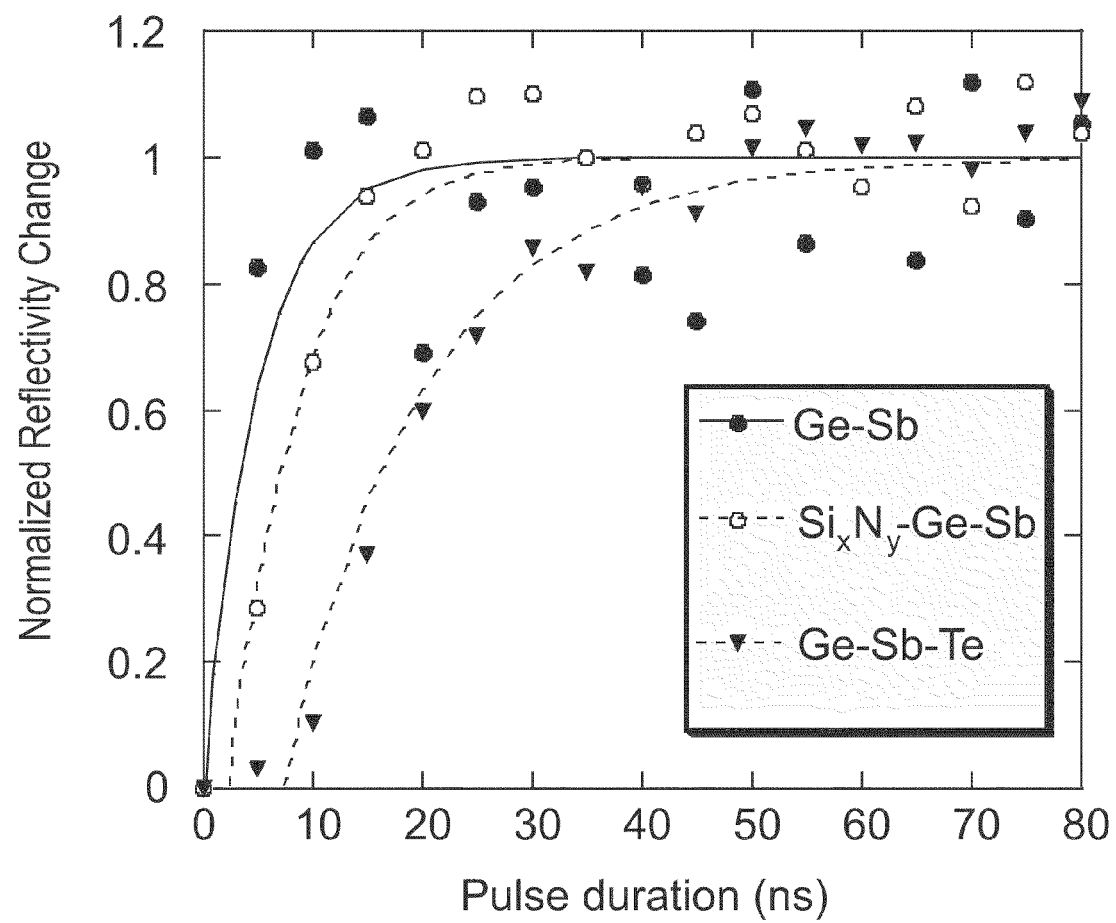
FIG. 8 shows reflectivity data for doped Ge—Sb, undoped Ge—Sb, and undoped Ge—Sb—Te thin films, from which recrystallization times (and thus switching speeds) can be deduced.

FIG. 8 shows the normalized change in reflectivity of the phase change materials Ge—Sb and GST. A portion of an initially crystalline sample was melt-quenched by a focused, 100 mW laser beam to form a melt-quenched amorphous region in the sample that was surrounded by crystalline material. At this point, a second laser was used to measure the reflectivity $R_{am}$ of this amorphous region, but its power was deliberately kept low (only 0.7 mW) to avoid inducing any phase change. This melt-quenched amorphous region was then exposed to 45 mW from the first laser for between 5 and 80 ns (using the same degree of focusing and optical alignment as in the melt-quenching step). For sufficiently long exposure times, this exposed region completely recrystallized, whereas for shorter pulses this exposed region would either partially recrystallize or remain completely amorphous. The second laser was used to record the reflectivity $R_{exp}$ of this exposed region, as well as the reflectivity $R_{cryst}$ of the fully crystallized film. The normalized change in reflectivity $R_{norm}$ shown in FIG. 8 is given by:

$$R_{norm} = (R_{exp} - R_{am})/(R_{cryst} - R_{am}) \quad (1)$$

As is evident from FIG. 8, doped and undoped Ge—Sb are very "fast" phase change materials and have crystallization times even shorter than GST, which is the industry standard for many optical and solid state memory devices. The crystallization time can be taken to be the laser pulse duration for which $R_{norm}=0.9$; this crystallization time may be regarded as a lower bound for the SET time.

Figure 9:
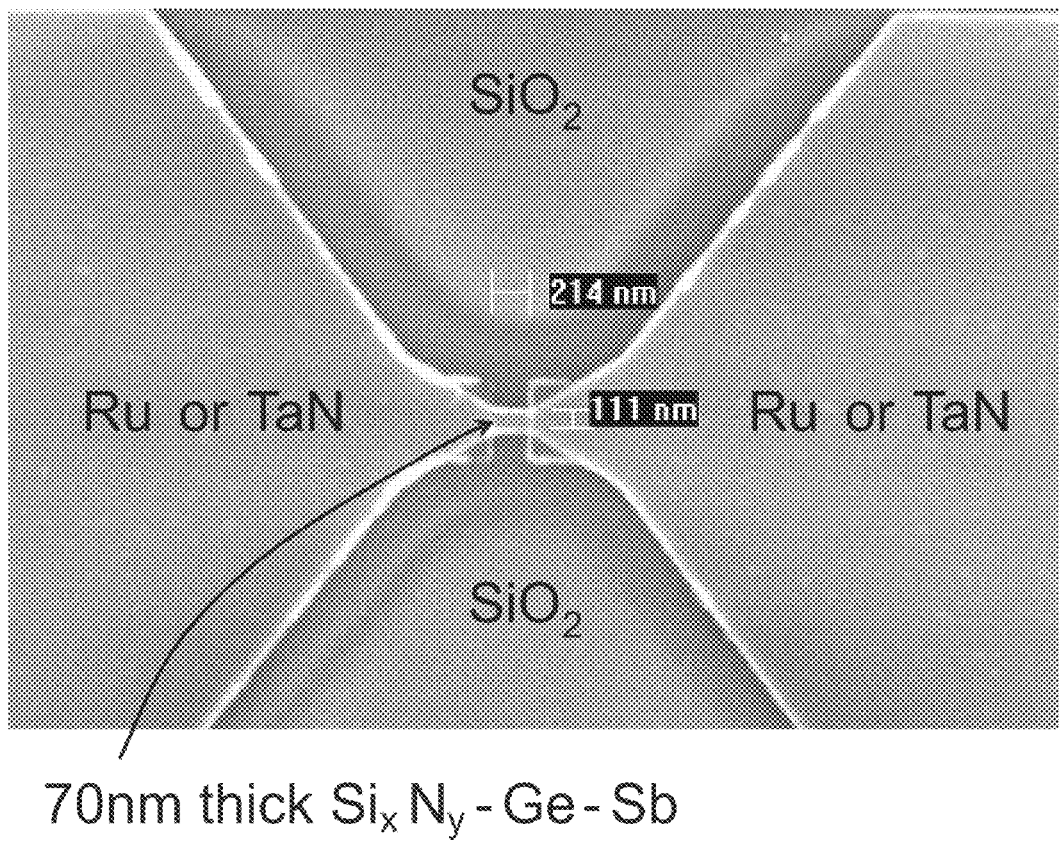
FIGS. 9 and 10 are Scanning Electron Microscopy (SEM) images of two different phase change memory devices.
Figure 10:
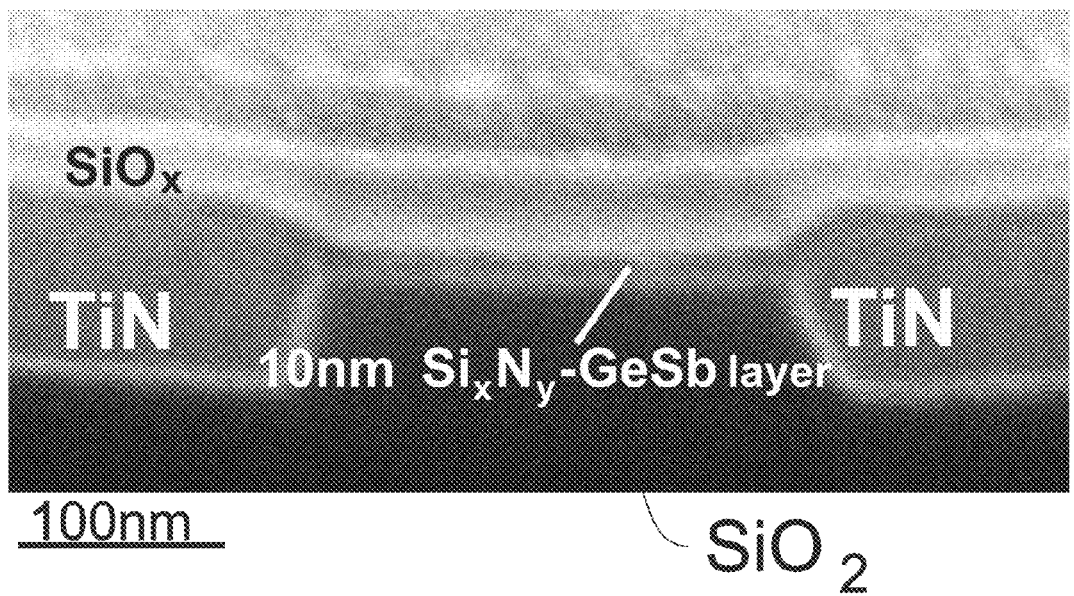

FIGS. 9 and 10 are views of solid state phase change memory devices, which have a design similar to the one shown in FIG. 1E and which used $Si_xN_y$—Ge—Sb as the PCM. FIG. 9 is a Scanning Electron Microscopy (SEM) image (top view) of a planar device that included two large TaN or Ru contact pads connected by a narrow line of the PCM, all of which were deposited over a $SiO_2$ substrate. The thickness of this PCM was 70 nm, and as indicated in FIG. 9, it had a width of about 111 nm and a length of about 214 nm. Devices having phase change materials of other dimensions were also fabricated and repeatedly switched between the SET and RESET states.

The cross-sectional SEM image of FIG. 10 is of a phase change material memory device having TiN contact electrodes, a $SiO_2$ substrate, and a capping layer of $SiO_x$. This device, as well as the one shown in FIG. 9, was repeatedly switchable between the SET and RESET states. As indicated in FIG. 10, the PCM used in this particular device was 10 nm thick. However, devices with PCM lines as thin as 3 nm were also successfully fabricated for which a very low RESET current of 90 microamps and a very fast switching speed of <40 ns for both the SET and RESET currents were observed. It is not possible to fabricate PCM lines this thin using conventional GST, since GST films loose their continuity and integrity for thicknesses below about 5 nm.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

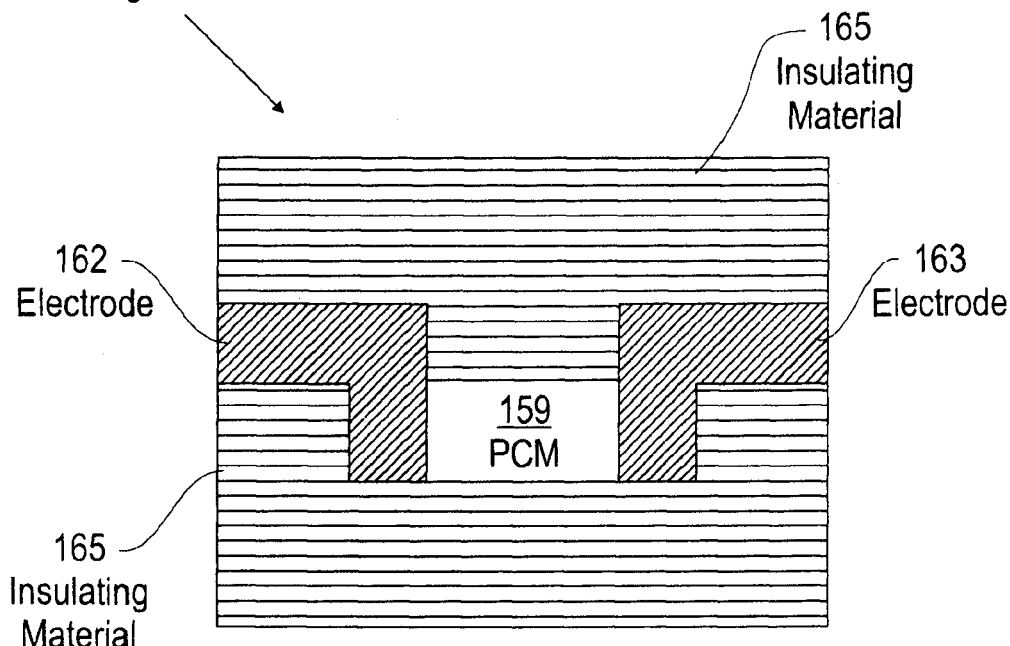

What is claimed is:

1. A device, comprising:
    phase change material consisting essentially of:
    i) Ge and Sb; and
    ii) a nitride compound as a dopant, wherein the nitride compound constitutes at least 5 atomic percent of the phase change material.

2. The device of claim 1, wherein the dopant includes N and Si.

3. The device of claim 1, wherein the dopant includes $Si_xN_y$, wherein each of x and y is greater than 0.

4. The device of claim 1, wherein the dopant includes $Si_xO_yN_z$, wherein each of x, y, and z is greater than 0.

5. The device of claim 1, wherein the dopant includes $Ti_xN_y$, wherein each of x and y is greater than 0.

6. The device of claim 1, wherein the dopant includes $Al_xO_yN_z$, wherein each of x, y, and z is greater than 0.

7. The device of claim 1, wherein the dopant includes $Al_xN_y$, wherein each of x and y is greater than 0.

8. The device of claim 1, wherein the dopant includes $Ta_xN_y$, wherein each of x and y is greater than 0.

9. The device of claim 1, wherein the nitride compound constitutes greater than 20 atomic percent of the phase change material.

10. The device of claim 1, wherein the nitride compound constitutes greater than 30 atomic percent of the phase change material.

11. The device of claim 1, wherein the dopant and concentrations of the dopant, Ge, and Sb are selected so that the phase change material has a crystallization temperature of at least 250° C. and a resistivity of at least 0.001 Ohm-cm.

12. The device of claim 1, wherein the dopant and concentrations of the dopant, Ge, and Sb are selected so that the phase change material has a crystallization temperature that is at least 60° C. greater than it would be in the absence of any nitride dopant.

13. The device of claim 1, wherein the dopant and concentrations of the dopant, Ge, and Sb are selected so that the phase change material has a crystallization temperature that is at least 100° C. greater than it would be in the absence of any nitride dopant.

14. The device of claim 1, further comprising:
electrodes disposed on different sides of the phase change material for conducting electrical current through the phase change material;
a substrate underlying the phase change material; and
a capping layer overlying the phase change material.

15. The device of claim 1, further comprising a component that includes at least one of the following: a) electrodes for passing current through the phase change material, thereby heating the phase change material, b) a scanning probe microscopy-based element for applying heat to the phase change material, and c) a laser having output used to heat the phase change material,
wherein the component enables at least one of the following: reading data from the phase change material and writing data into the phase change material.

16. The device of claim 1, wherein the phase change material has at least two phases having respective resistivities whose ratio is at least 100.

17. The device of claim 16, wherein the dopant and concentrations of the dopant, Ge, and Sb are selected so that the phase change material has a crystallization temperature of at least 250° C. and a resistivity of at least 0.001 Ohm-cm.

18. A device, comprising:
phase change material consisting essentially of:
i) Ge and Sb; and
ii) a nitride compound as a dopant, wherein the nitride compound constitutes at least 1 atomic percent of the phase change material.

19. The device of claim 18, further comprising:
electrodes disposed on different sides of the phase change material for conducting electrical current through the phase change material;
a substrate underlying the phase change material; and
a capping layer overlying the phase change material.

20. The device of claim 18, further comprising a component that includes at least one of the following: a) electrodes for passing current through the phase change material, thereby heating the phase change material, b) a scanning probe microscopy-based element for applying heat to the phase change material, and c) a laser having output used to heat the phase change material,
wherein the component enables at least one of the following: reading data from the phase change material and writing data into the phase change material.

* * * * *

UNITED STATES PATENT AND TRADEMARK OFFICE
CERTIFICATE OF CORRECTION

| | | |
|---|---|---|
| PATENT NO. | : 7,875,873 B2 | |
| APPLICATION NO. | : 12/336497 | |
| DATED | : January 25, 2011 | |
| INVENTOR(S) | : Chen et al. | |

It is certified that error appears in the above-identified patent and that said Letters Patent is hereby corrected as shown below:

Delete Title Page, and replace with new Title Page. (attached)

In Column 12, line 27, add the following claims:

21. The device of Claim 1, wherein the dopant and the concentrations of the dopant, Ge, and Sb are selected so that the phase change material has a crystallization time of less than 20 nanoseconds.

22. The device of Claim 1, wherein the dopant and the concentrations of the dopant, Ge, and Sb are selected so that the phase change material has a crystallization time of less than 10 nanoseconds.

23. The device of Claim 18, wherein the dopant and the concentrations of the dopant, Ge, and Sb are selected so that the phase change material has a crystallization time of less than 20 nanoseconds.

24. The device of Claim 18, wherein the dopant and the concentrations of the dopant, Ge, and Sb are selected so that the phase change material has a crystallization time of less than 10 nanoseconds.

Signed and Sealed this
Fifteenth Day of March, 2011

David J. Kappos
*Director of the United States Patent and Trademark Office*

(12) United States Patent
Chen et al.

(10) Patent No.: US 7,875,873 B2
(45) Date of Patent: Jan. 25, 2011

(54) PHASE CHANGE MATERIALS AND ASSOCIATED MEMORY DEVICES

(75) Inventors: Yi-Chou Chen, San Jose, CA (US); Frances Anne Houle, Fremont, CA (US); Simone Raoux, Santa Clara, CA (US); Charles Rettner, San Jose, CA (US); Alejandro Gabriel Schrott, New York, NY (US)

(73) Assignees: International Business Machines Corporation, Armonk, NY (US); Macronix International Co., Ltd., Hsinchu (TW)

(*) Notice: Subject to any disclaimer, the term of this patent is extended or adjusted under 35 U.S.C. 154(b) by 227 days.

(21) Appl. No.: 12/336,497

(22) Filed: Dec. 16, 2008

(65) Prior Publication Data
US 2009/0095953 A1    Apr. 16, 2009

Related U.S. Application Data

(63) Continuation of application No. 11/465,077, filed on Aug. 16, 2006, now Pat. No. 7,501,648.

(51) Int. Cl.
*H01L 45/00* (2006.01)
(52) U.S. Cl. .................. 257/4; 257/E45.003
(58) Field of Classification Search ............ 257/2, 257/3, 4, E29.592
See application file for complete search history.

(56) References Cited

U.S. PATENT DOCUMENTS

| | | | |
|---|---|---|---|
| 5,596,522 A * | 1/1997 | Ovshinsky et al. | 365/113 |
| 5,825,046 A * | 10/1998 | Czubatyj et al. | 257/2 |
| 7,279,380 B2 * | 10/2007 | Lung | 438/244 |
| 7,491,573 B1 * | 2/2009 | Schrott et al. | 438/95 |

* cited by examiner

*Primary Examiner*—Roy K Potter
(74) *Attorney, Agent, or Firm*—Daniel E. Johnson

(57) ABSTRACT

A memory device utilizes a phase change material as the storage medium. The phase change material includes at least one of Ge, Sb, Te, Se, As, and S, as well as a nitride compound as a dopant. The memory device can be a solid-state memory cell with electrodes in electrical communication with the phase change medium, an optical phase change storage device in which data is read and written optically, or a storage device based on the principle of scanning probe microscopy.

20 claims, 14 Drawing Sheets

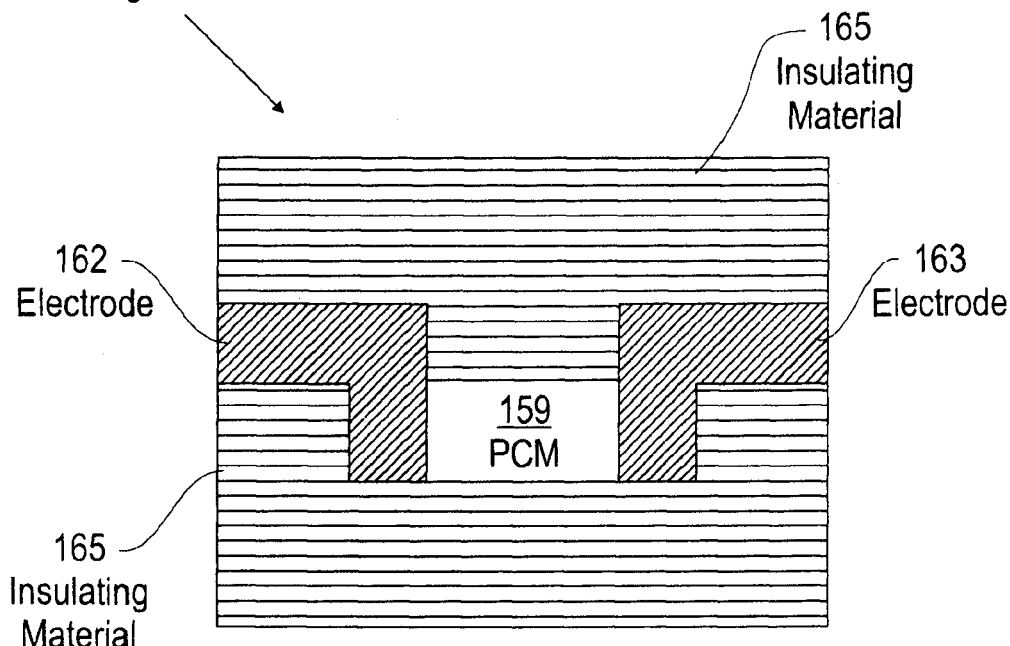

UNITED STATES PATENT AND TRADEMARK OFFICE
CERTIFICATE OF CORRECTION

Page 1 of 2

PATENT NO.         : 7,875,873 B2
APPLICATION NO.    : 12/336497
DATED              : January 25, 2011
INVENTOR(S)        : Chen et al.

It is certified that error appears in the above-identified patent and that said Letters Patent is hereby corrected as shown below:

Delete Title Page, and replace with new Title Page. (attached)

In Column 12, line 27, add the following claims:

21. The device of Claim 1, wherein the dopant and the concentrations of the dopant, Ge, and Sb are selected so that the phase change material has a crystallization time of less than 20 nanoseconds.

22. The device of Claim 1, wherein the dopant and the concentrations of the dopant, Ge, and Sb are selected so that the phase change material has a crystallization time of less than 10 nanoseconds.

23. The device of Claim 18, wherein the dopant and the concentrations of the dopant, Ge, and Sb are selected so that the phase change material has a crystallization time of less than 20 nanoseconds.

24. The device of Claim 18, wherein the dopant and the concentrations of the dopant, Ge, and Sb are selected so that the phase change material has a crystallization time of less than 10 nanoseconds.

This certificate supersedes the Certificate of Correction issued March 15, 2011.

Signed and Sealed this
Twenty-sixth Day of April, 2011

David J. Kappos
*Director of the United States Patent and Trademark Office*

(12) United States Patent
Chen et al.

(10) Patent No.: US 7,875,873 B2
(45) Date of Patent: Jan. 25, 2011

(54) PHASE CHANGE MATERIALS AND ASSOCIATED MEMORY DEVICES

(75) Inventors: Yi-Chou Chen, San Jose, CA (US); Frances Anne Houle, Fremont, CA (US); Simone Raoux, Santa Clara, CA (US); Charles Rettner, San Jose, CA (US); Alejandro Gabriel Schrott, New York, NY (US)

(73) Assignees: International Business Machines Corporation, Armonk, NY (US); Macronix International Co., Ltd., Hsinchu (TW)

( * ) Notice: Subject to any disclaimer, the term of this patent is extended or adjusted under 35 U.S.C. 154(b) by 227 days.

(21) Appl. No.: 12/336,497

(22) Filed: Dec. 16, 2008

(65) Prior Publication Data

US 2009/0095953 A1    Apr. 16, 2009

Related U.S. Application Data

(63) Continuation of application No. 11/465,077, filed on Aug. 16, 2006, now Pat. No. 7,501,648.

(51) Int. Cl.
    *H01L 45/00* (2006.01)
(52) U.S. Cl. .................................. 257/4; 257/E45.003
(58) Field of Classification Search .................. 257/2, 257/3, 4, E29.592
    See application file for complete search history.

(56) References Cited

U.S. PATENT DOCUMENTS

| 5,596,522 A | * | 1/1997 | Ovshinsky et al. | 365/113 |
| 5,825,046 A | * | 10/1998 | Czubatyj et al. | 257/2 |
| 7,279,380 B2 | * | 10/2007 | Lung | 438/244 |
| 7,491,573 B1 | * | 2/2009 | Schrott et al. | 438/95 |

* cited by examiner

*Primary Examiner*—Roy K Potter
(74) *Attorney, Agent, or Firm*—Daniel E. Johnson

(57) ABSTRACT

A memory device utilizes a phase change material as the storage medium. The phase change material includes at least one of Ge, Sb, Te, Se, As, and S, as well as a nitride compound as a dopant. The memory device can be a solid-state memory cell with electrodes in electrical communication with the phase change medium, an optical phase change storage device in which data is read and written optically, or a storage device based on the principle of scanning probe microscopy.

20 claims, 14 Drawing Sheets